(12) United States Patent
Ahn et al.

(10) Patent No.: US 9,923,037 B2
(45) Date of Patent: *Mar. 20, 2018

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-Do (KR)

(72) Inventors: Kiwan Ahn, Yongin-si (KR); Yongjae Jang, Yongin-si (KR); Youngeun Oh, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/377,806

(22) Filed: Dec. 13, 2016

(65) Prior Publication Data

US 2017/0092706 A1    Mar. 30, 2017

Related U.S. Application Data

(63) Continuation of application No. 14/597,661, filed on Jan. 15, 2015, now Pat. No. 9,548,344.

(30) Foreign Application Priority Data

Jul. 16, 2014 (KR) .................. 10-2014-0089801

(51) Int. Cl.
*H01L 29/08* (2006.01)
*H01L 27/32* (2006.01)
(Continued)

(52) U.S. Cl.
CPC ...... *H01L 27/3248* (2013.01); *H01L 27/3246* (2013.01); *H01L 27/3258* (2013.01);
(Continued)

(58) Field of Classification Search
CPC ............. H01L 27/1214; H01L 27/3246; H01L 27/3248; H01L 27/3258; H01L 27/3262; H01L 51/5284
(Continued)

(56) References Cited

U.S. PATENT DOCUMENTS 5,306,947 A * 4/1994 Adachi ............ H01L 21/02137
257/635
2006/0027804 A1* 2/2006 Yamazaki ............ G02F 1/1368
257/59
(Continued)

FOREIGN PATENT DOCUMENTS

KR   10-2006-0001710 A   1/2006
KR   10-2011-0059966 A   6/2011
(Continued)

*Primary Examiner* — Mohammed Shamsuzzaman
(74) *Attorney, Agent, or Firm* — Knobbe, Martens, Olson & Bear, LLP

(57) ABSTRACT

An organic light-emitting display apparatus including a substrate; a thin-film transistor (TFT) arranged on the substrate; a black matrix located between the substrate and the TFT; a pixel electrode, which is located between the substrate and the TFT and having edge portions covered by the black matrix; an insulation layer, which covers the TFT and opens the top surface of the pixel electrode; an organic emission layer, which is arranged on the pixel electrode; and a counter electrode, which is arranged on the organic emission layer.

8 Claims, 9 Drawing Sheets

(51) Int. Cl.
    *H01L 51/52*   (2006.01)
    *H01L 27/12*   (2006.01)
(52) U.S. Cl.
    CPC ...... *H01L 27/3262* (2013.01); *H01L 51/5284* (2013.01); *H01L 27/1214* (2013.01)
(58) Field of Classification Search
    USPC .................... 257/59, 72, 88, 642; 438/151
    See application file for complete search history.

(56) References Cited

U.S. PATENT DOCUMENTS

| | | | | |
|---|---|---|---|---|
| 2007/0064179 | A1* | 3/2007 | Park | G02F 1/136209 349/110 |
| 2007/0295973 | A1* | 12/2007 | Jinbo | H01L 27/1214 257/88 |
| 2010/0194268 | A1 | 8/2010 | Choi et al. | |
| 2011/0127499 | A1 | 6/2011 | Yoon et al. | |
| 2012/0169683 | A1* | 7/2012 | Hong | H01L 27/3211 345/206 |
| 2013/0119387 | A1* | 5/2013 | Park | H01L 51/5284 257/59 |
| 2013/0228786 | A1* | 9/2013 | Park | H01L 51/5268 257/72 |
| 2014/0011327 | A1* | 1/2014 | Sasaki | H01L 27/1225 438/151 |
| 2014/0042394 | A1* | 2/2014 | Lee | H01L 51/5203 257/40 |

FOREIGN PATENT DOCUMENTS

| | | |
|---|---|---|
| KR | 10-2012-0051337 A | 5/2012 |
| KR | 10-2013-0054014 A | 5/2013 |

* cited by examiner

ORGANIC LIGHT-EMITTING DISPLAY APPARATUS AND METHOD OF MANUFACTURING THE SAME

CROSS-REFERENCE TO RELATED APPLICATIONS

Any and all applications for which a foreign or domestic priority claim is identified in the Application Data Sheet as filed with the present application are hereby incorporated by reference under 37 CFR 1.57. For example, this application is a continuation of U.S. application Ser. No. 14/597,661, filed on Jan. 15, 2015, which claims the benefit of Korean Patent Application No. 10-2014-0089801, filed on Jul. 16, 2014, in the Korean Intellectual Property Office, the disclosures of which are incorporated herein in their entireties by reference.

BACKGROUND

Field

The disclosure relates to organic light-emitting display apparatuses and methods of manufacturing the same.

Description of the Related Technology

An organic light-emitting display apparatus is a self-luminescent display device which includes a hole injection electrode, an electron injection electrode, and an organic emission layer formed between the hole injection electrode and the electron injection electrode and emits light as holes injected by the hole injection electrode and electrons injected by the electron injection electrode are recombined and disintegrated. An organic light-emitting display apparatus exhibits various high quality characteristics, such as low power consumption, high brightness, and fast response speed, thus being spotlighted as a next-generation display apparatus.

SUMMARY

One or more embodiments of the present disclosure include an organic light emitting-display apparatus with high optical efficiency, low manufacturing cost, and a method of manufacturing the same.

Additional aspects will be set forth in part in the description which follows and, in part, will be apparent from the description, or may be learned by practice of the presented embodiments.

According to one or more embodiments of the present disclosure, an organic light-emitting display apparatus includes a substrate; a thin-film transistor (TFT) arranged on the substrate; a black matrix located between the substrate and the TFT; a pixel electrode, which is located between the substrate and the TFT and having edge portions covered by the black matrix; an insulation layer, which covers the TFT and opens the top surface of the pixel electrode; an organic emission layer, which is arranged on the pixel electrode; and a counter electrode, which is arranged on the organic emission layer.

The TFT includes an active layer, a gate electrode, a source electrode, and a drain electrode, and at least one from among the active layer, the gate electrode, the source electrode, and the drain electrode is formed directly on the black matrix.

The pixel electrode is connected to the source electrode or the drain electrode of the TFT via a contact hole formed in the black matrix.

The black matrix contains a material that is resistant to a temperature equal to or higher than 550° C.

The black matrix contains silicon resin.

The insulation layer that exposes the pixel electrode dads side surfaces of the black matrix.

A barrier layer is arranged on the pixel electrode.

The barrier layer contains the same metal as the source electrode and the drain electrode.

The barrier layer is covered with the black matrix.

The black matrix contains the material as shown in Formula 1 below.

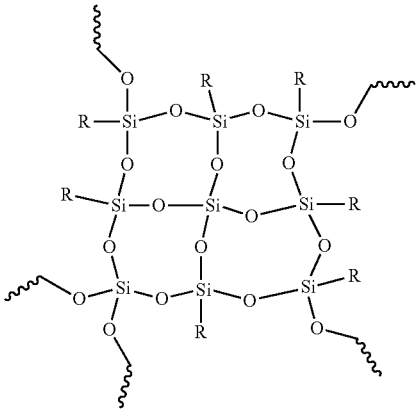

Formula 1

The pixel electrode contains a transparent material, and the counter electrode contains a reflective material.

According to one or more embodiments of the present disclosure, a method of manufacturing an organic light-emitting display apparatus, the method includes forming a pixel electrode on a substrate; forming a black matrix to cover end portions of the pixel electrode; forming a TFT on the black matrix; forming an insulation layer to cover the TFT and to expose the top surface of the pixel electrode; forming an organic emission layer on the pixel electrode; and forming a counter electrode on the organic emission layer.

The TFT includes an active layer, a gate electrode, a source electrode, and a drain electrode, the black matrix contains a material that is resistant to a temperature equal to or higher than 550° C., and at least one from among the active layer, the gate electrode, the source electrode, and the drain electrode is formed directly on the black matrix.

The black matrix contains silicon resin.

The insulation layer is formed to clad side surfaces of the black matrix.

A barrier layer is further formed on the pixel electrode, and, in case of forming patterns for the source electrode and the drain electrode, the barrier layer is also etched together with the source electrode and the drain electrode.

The barrier layer contains the same metal as the source electrode and the drain electrode.

The barrier layer is covered with the black matrix.

A contact hole is formed in the black matrix, and the pixel electrode contacts the source electrode and the drain electrode of the TFT via the contact hole The pixel electrode contains a transparent material, and the counter electrode contains a reflective material.

BRIEF DESCRIPTION OF THE DRAWINGS

These and/or other aspects will become apparent and more readily understood from the following description of the embodiments, taken in conjunction with the accompanying drawings in which.

DETAILED DESCRIPTION

Figure 1:
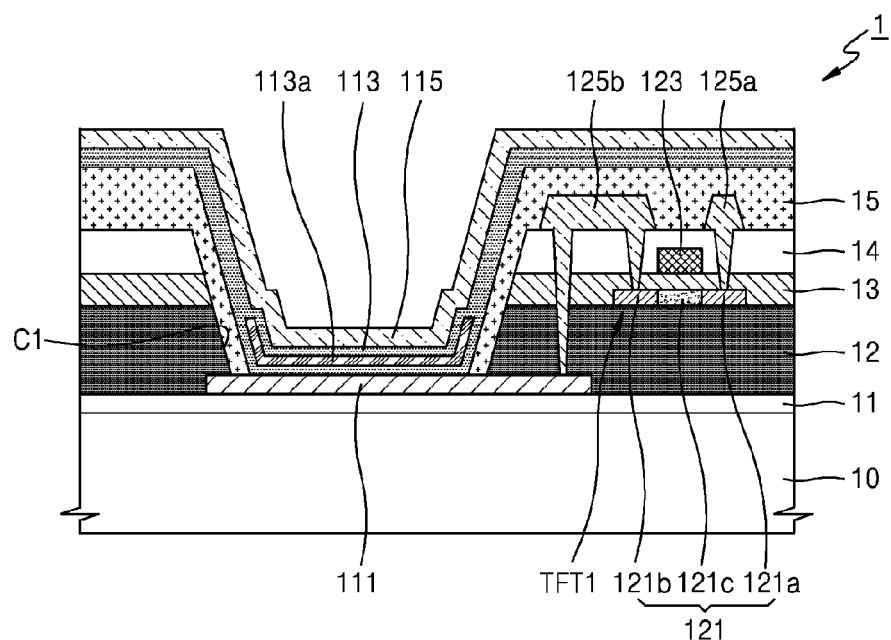
FIG. 1 is a schematic sectional view of an organic light-emitting display (OLED) apparatus according to a first embodiment.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. As used herein, the term "and/or" includes any and all combinations of one or more of the associated listed items.

Embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

FIG. 1 is a schematic sectional view of an organic light-emitting display (OLED) apparatus 1 according to a first embodiment of the present disclosure.

Referring to FIG. 1, a pixel electrode 111, a counter electrode 115, and an intermediate layer 113, which includes at least an organic emission layer 113a and is arranged between the pixel electrode 111 and the counter electrode 115, are arranged on a substrate 10 of the organic light-emitting display apparatus 1 according to the first embodiment.

According to the present embodiment, light emitted by the organic emission layer 113a is reflected by the counter electrode 115, is transmitted through the pixel electrode 111, and is emitted toward the substrate 10. In other words, the organic light-emitting display apparatus 1 according to the present embodiment is a bottom-emitting type OLED apparatus.

The substrate 10 may include not only a glass substrate, but also a plastic substrate formed of polyethylene terephthalate (PET), polyethylene naphthalate (PEN), polyimide, etc.

A buffer layer 11 may be further arranged to form a flat surface on the top of the substrate 10 and to prevent permeation of impurity atoms. The substrate 10 may be formed as a single layer or multiple layers containing silicon nitride and/or silicon oxides.

The pixel electrode 111 may include a transparent material, whereas the counter electrode 115 may include a reflective material. The pixel electrode 111 may be used as an anode, whereas the counter electrode 115 may be used as a cathode and the polarities of electrodes may be reversed.

The intermediate layer 113 including at least the organic emission layer 113a is arranged between the pixel electrode 111 and the counter electrode 115. Although not shown in FIG. 1, at least one of the layers from among a hole injection layer, a hole transport layer, an electron transport layer, and an electron injection layer may further be arranged between the pixel electrode 111 and the counter electrode 115. However, the present disclosure is not limited thereto, and any of various other function layers may be arranged.

A thin-film transistor (TFT) TFT1 is arranged apart from a side of the pixel electrode 111. The TFT TFT1 includes an active layer 121, a gate electrode 123, a source electrode 125a, and a drain electrode 125b.

The active layer 121 may include a channel region 121c and a source region 121a and a drain region 121b, which are outside the channel region 121c and are doped with ion impurities. According to the present embodiment, the active layer 121 may contain a polysilicon, which is formed by crystallizing amorphous silicon via a crystallizing process.

A first insulation layer 13, which is a gate insulation layer, is formed on the active layer 121, and a gate electrode 123 is arranged on the first insulation layer 13 at a location corresponding to the channel region 121c.

The gate electrode 123 may be formed as a single layer or multiple layers containing one or more metals selected from among aluminum (Al), platinum (Pt), palladium (Pd), silver (Ag), magnesium (Mg), gold (Au), nickel (Ni), neodymium (Nd), iridium (Ir), chrome (Cr), nickel(Ni), calcium (Ca), molybdenum (Mo), titanium (Ti), tungsten (W), and copper (Cu).

A second insulation layer 14, which is an interlayer insulation layer, is formed on the gate electrode 123, and the source electrode 125a and the drain electrode 125b are arranged on the second insulation layer 14.

The source electrode 125a and the drain electrode 125b contact the source region 121a and the drain region 121b of the active layer 121 via an opening (not shown) formed in the second insulation layer 14, respectively. The source electrode 125a and the drain electrode 125b may be formed as a single layer or multiple layers containing one or more metals selected from among aluminum (Al), platinum (Pt), palladium (Pd), silver (Ag), magnesium (Mg), gold (Au), nickel (Ni), neodymium (Nd), iridium (Ti), chrome (Cr), nickel(Ni), calcium (Ca), molybdenum (Mo), titanium (Ti), tungsten (W), and copper (Cu).

A black matrix 12 is arranged between the substrate 10 and the TFT TFT1. The black matrix 12 is formed to cover edge portions of the pixel electrode 111 and contains an organic material that is resistant to a temperature equal to or higher than 550° C. The black matrix 12 may contain the material as shown in Formula 1 below. Meanwhile, the black matrix 12 may contain silicon resin.

Formula 1

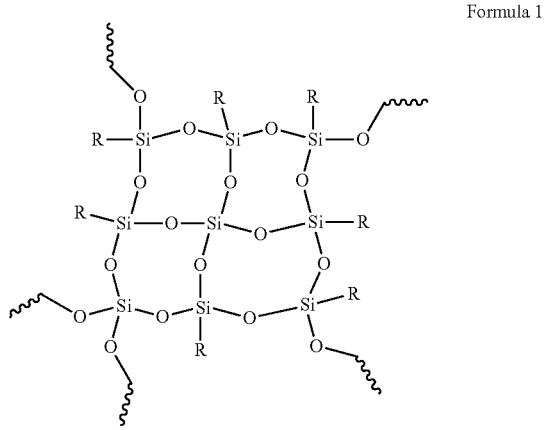

At least one from among the active layer 121, the gate electrode 123, the source electrode 125a, and the drain electrode 125b of the TFT TFT1 as described above is arranged directly on the black matrix 12. According to the present embodiment, a structure in which the active layer 121 is arranged directly on the black matrix 12 is disclosed. According to the present embodiment, since the black matrix 12 is formed as an organic insulation layer, the black matrix 12 may function as a planarizing layer.

When viewed at a position perpendicular to the substrate 10, the pixel electrode 111 is located between the substrate 10 and the TFT TFT1. Edge portions of the pixel electrode 111 are covered by the black matrix 12. Via a contact hole C2 (refer to FIG. 2B) formed in the black matrix 12, the pixel electrode 111 is connected to the source electrode 125a or the drain electrode 125b of the TFT TFT1.

A third insulation layer 15 includes an opening C7 (refer to FIG. 2G), which covers the TFT TFT1 and exposes the top surface of the pixel electrode 111. The third insulation layer 15 also covers the side surfaces of the black matrix 12.

FIGS. 2A through 2G are schematic sectional views showing a method of manufacturing the organic light-emitting display apparatus 1 according to the first embodiment.

Figure 2A:
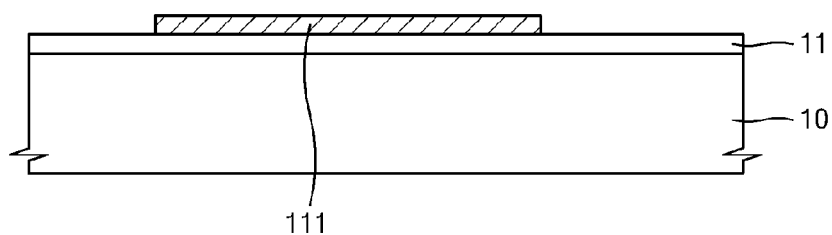
FIGS. 2A through 2G are schematic sectional views showing a method of manufacturing the organic light-emitting display apparatus according to the first embodiment.

Referring to FIG. 2A, the buffer layer 11 is formed on the substrate 10, a transparent conductive layer (not shown) is formed on the buffer layer 11, and the pixel electrode 111 is formed by patterning the same.

Figure 2B:
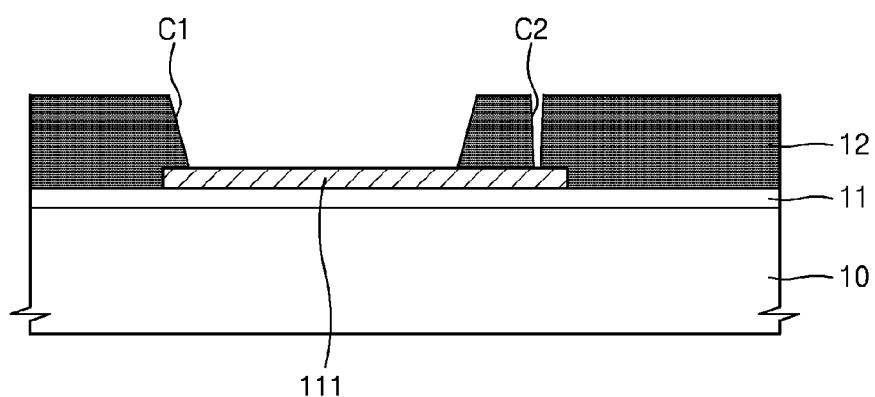

Referring to FIG. 2B, an insulation layer including an organic material is formed on the pixel electrode 111, and the black matrix 12 is formed by patterning the same.

The black matrix 12 covers the edge portions of the pixel electrode 111, and openings C1 and C2 are formed to expose the top surface of the pixel electrode 111.

The black matrix 12 contains an organic material that is resistant to a temperature equal to or higher than 550° C. For example, the black matrix 12 may include the material shown in Formula 1 above. Furthermore, the black matrix 12 may be formed by using an alkali-soluble, UV-hardening silicon resin as a binder. Therefore, the black matrix 12 containing a silicon resin may be patterned by using a photo mask.

Figure 2C:
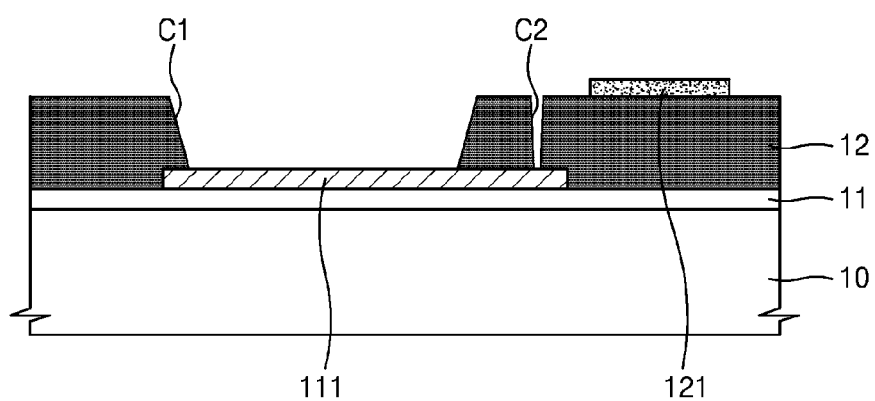

Referring to FIG. 2C, the active layer 121 is formed on the black matrix 12. The active layer 121 may be formed of an amorphous silicon first, and then the active layer 121 may be formed as a polysilicon via a crystalline process. Methods of crystallizing amorphous silicon may include rapid thermal annealing (RTA), solid phase crystallization (SPC), excimer laser annealing (ELA), metal induced crystallization (MIC), metal induced lateral crystallization (MILC), sequential lateral solidification (SLS), etc. Here, since the black matrix 12 below the active layer 121 contains a highly heat-resistant organic insulation material, the active layer 121 may be formed directly on the black matrix 12.

Figure 2D:
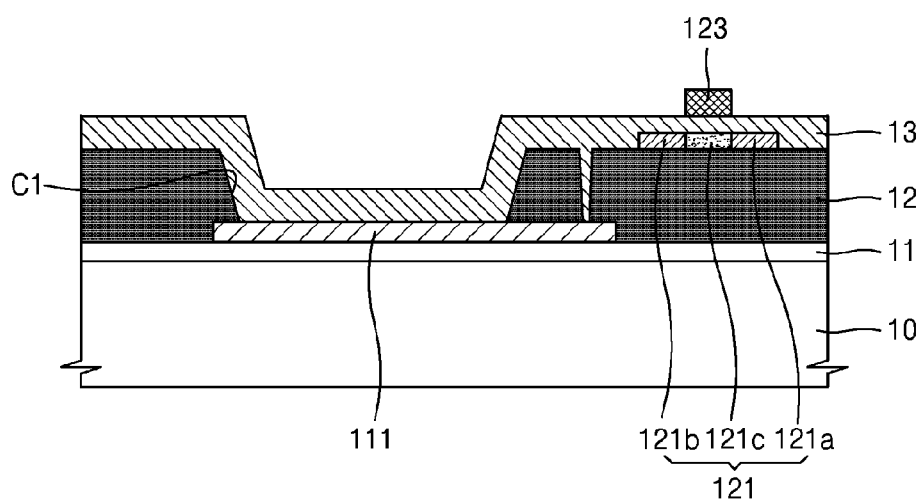

Referring to FIG. 2D, the first insulation layer 13 is formed on the black matrix 12, and the gate electrode 123 is formed on the first insulation layer 13.

Although not shown, the active layer 121 is doped with ion impurities by using the gate electrode 123 as a self-align mask. The active layer 121 includes the source region 121a and the drain region 121b that are doped with ion impurities and the channel region 121c arranged between the source region 121a and the drain region 121b.

Figure 2E:
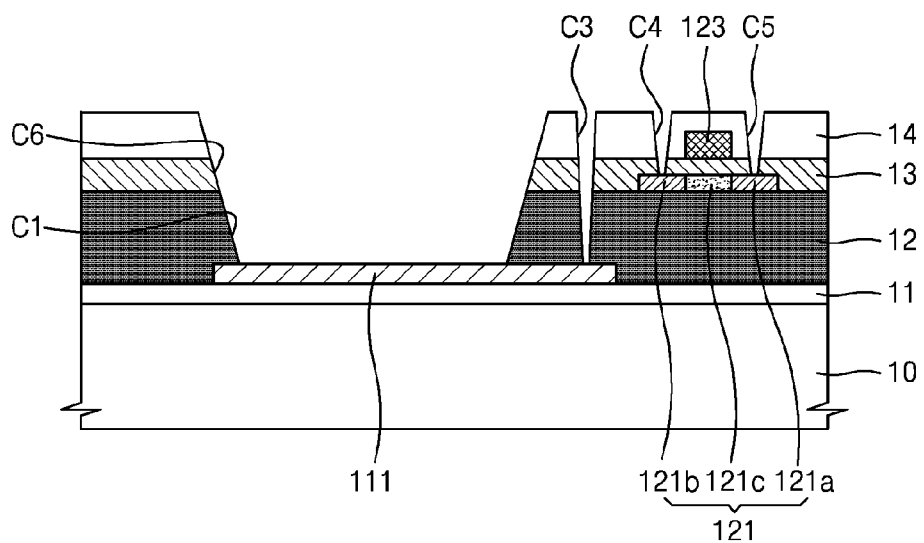

Referring to FIG. 2E, after the gate electrode 123 is formed, the second insulation layer 14 is formed. Openings C6 and C3 exposing the top surface of the pixel electrode 111 and openings C4 and C5 exposing the source region 121a and the drain region 121b are formed by simultaneously patterning the second insulation layer 14 and the first insulation layer 13.

The opening C6 is formed to smoothly extend from the opening C1 of FIG. 2C, whereas the opening C3 is formed to smoothly extend from the opening C2 of FIG. 2C.

Figure 2F:
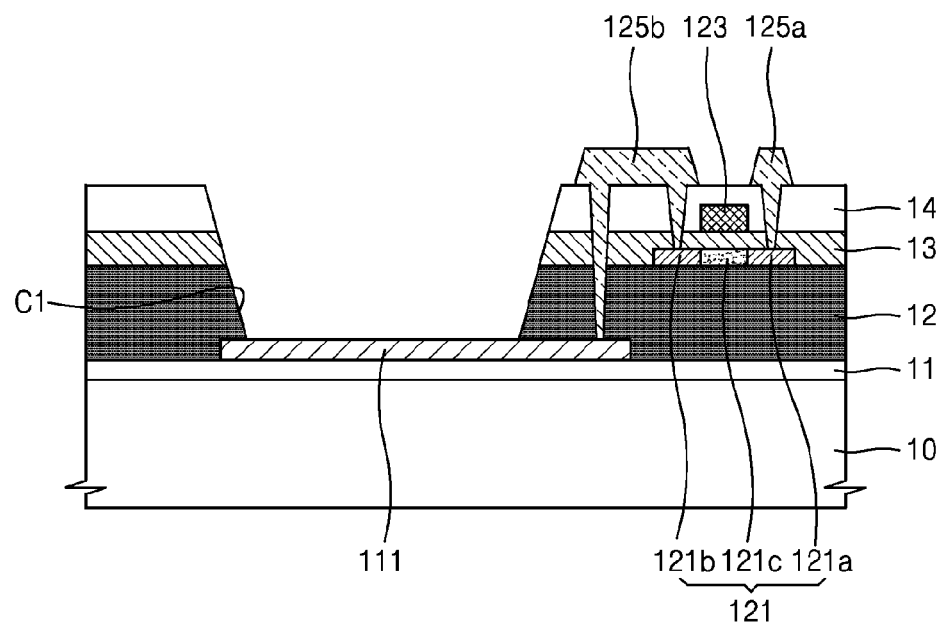

Referring to FIG. 2F, a metal layer (not shown) is formed on the result structure of the operation shown in FIG. 2E, and the source electrode 125a and the drain electrode 125b are formed by patterning the metal layer.

A second metal layer (not shown) may contain a metal selected from among aluminum (Al), platinum (Pt), palladium (Pd), silver (Ag), magnesium (Mg), gold (Au), nickel (Ni), neodymium (Nd), iridium (Ir), chrome (Cr), nickel (Ni), calcium (Ca), molybdenum (Mo), titanium (Ti), tungsten (W), copper (Cu), and alloys thereof.

Figure 2G:
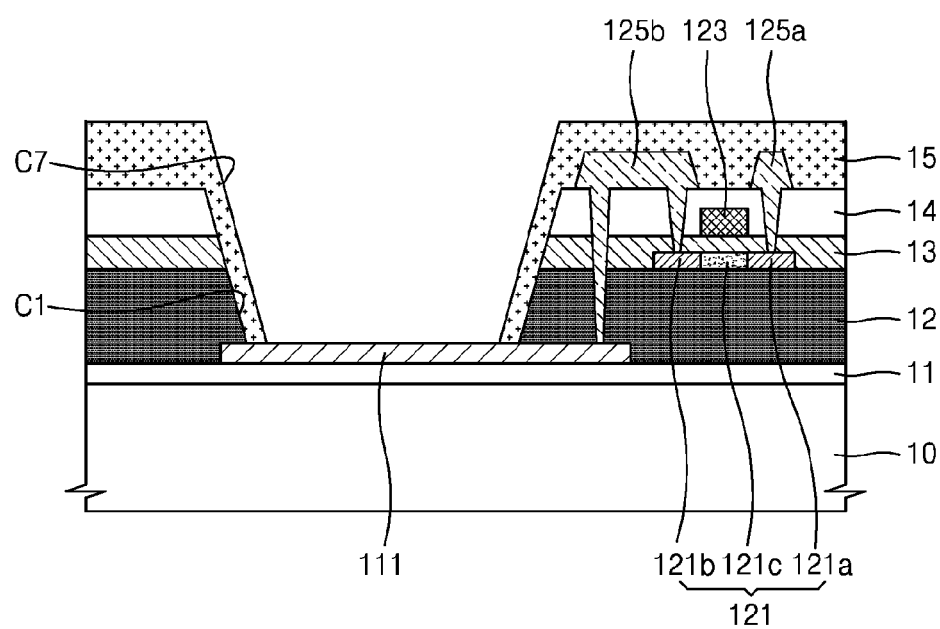

Referring to FIG. 2G, the third insulation layer 15 is formed on the result structure of the operation shown in FIG. 2F, and an opening C7 is formed to expose the top surface of the pixel electrode 111. The third insulation layer 15 dads the edge portions of the pixel electrode 111 and to cover side surfaces of the black matrix 12.

Since the black matrix 12 is formed in the organic light-emitting display apparatus 1 manufactured as described above, it is not necessary to use an expensive optical polarization film to reduce external light reflection. Furthermore, since the black matrix 12 is formed of a highly heat-resistant organic material and functions as a planarizing layer, it is not necessary to form a separate planarizing layer.

Figure 3:
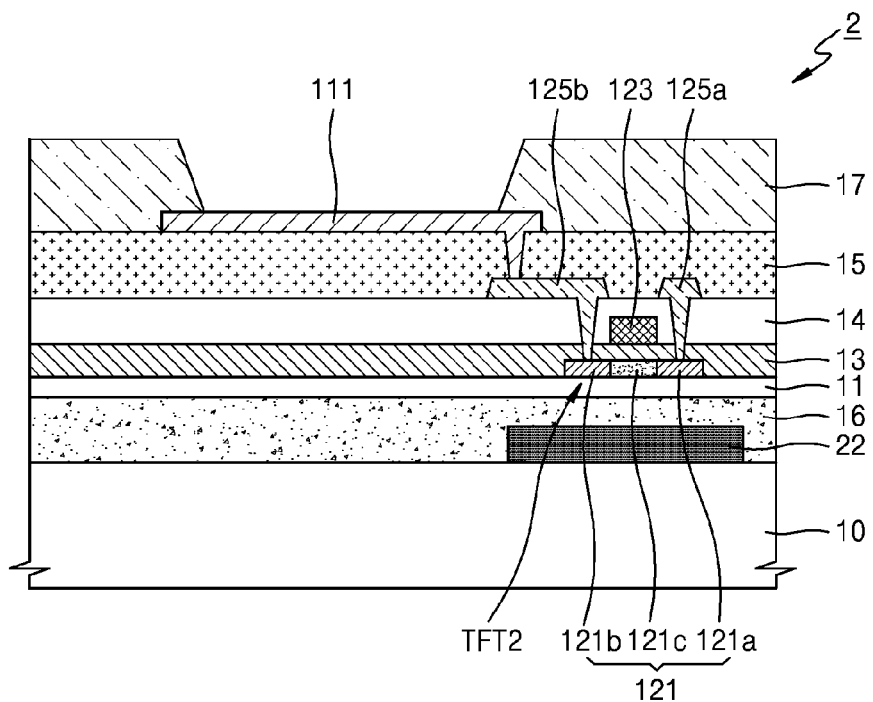
FIG. 3 is a schematic sectional view of an organic light-emitting display apparatus according to a comparative embodiment.

FIG. 3 is a schematic sectional view of an organic light-emitting display apparatus 2 according to a comparative embodiment.

In the organic light-emitting display apparatus 2 according to the comparative embodiment, a black matrix 22 is arranged between the substrate 10 and a TFT TFT2. The black matrix 22 according to the comparative embodiment is formed of a metal. Since the black matrix 22 is formed of a metal, it is necessary to arrange a planarizing layer on the black matrix 22. Meanwhile, an organic planarizing layer 16 is formed to suppress the black matrix 22 from being coupled with circuit wirings formed above the black matrix 22. After the organic planarizing layer 16 is formed, a series of photolithography operations are performed. For example, as photolithography operations for forming the active layer 121, the gate electrode 123, the source electrode 125a, and the drain electrode 125b and an operation for crystallizing the active layer 121 are performed, a defect that the organic planarizing layer 16 on the black matrix 22 formed of a metal is peeled off at a high temperature occurs.

However, in the organic light-emitting display apparatus 1 according to the present embodiment, since a black matrix is formed of a highly heat-resistant organic material and the black matrix functions as a planarizing layer, it is not necessary to arrange a separate planarizing layer. Therefore, no peel-off defect occurs between a metal black matrix and an organic planarizing layer.

Figure 4:
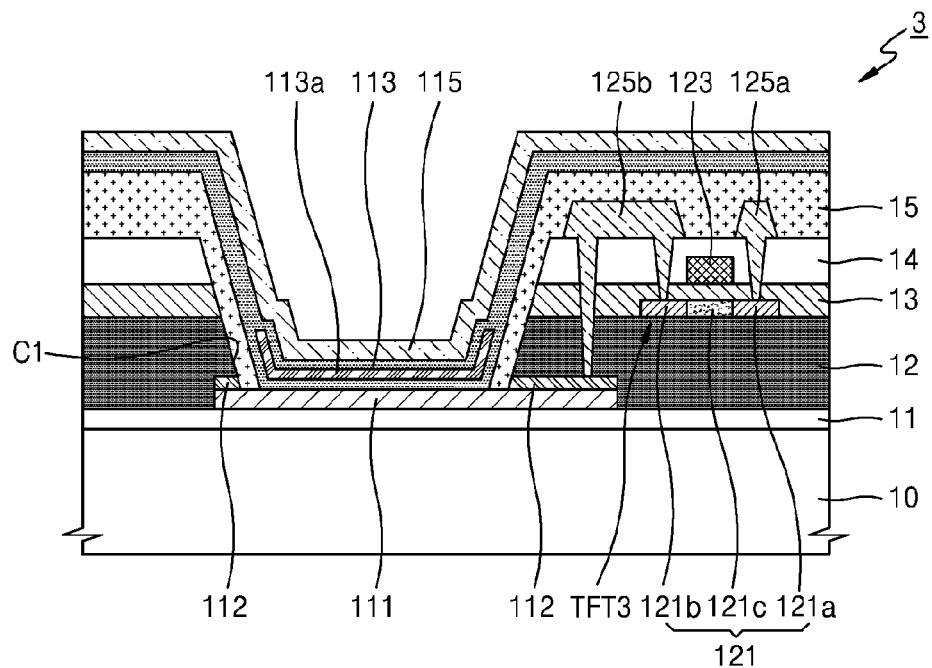
FIG. 4 is a schematic sectional view of an organic light-emitting display apparatus according to a second embodiment.

FIG. 4 is a schematic sectional view of an organic light-emitting display apparatus 3 according to a second embodiment. Hereinafter, descriptions of the present embodiment will focus on differences between the first embodiment and the second embodiment.

Referring to FIG. 4, in the organic light-emitting display apparatus 3 according to a second embodiment, the pixel electrode 111, the counter electrode 115, and the intermediate layer 113, which includes at least the organic emission layer 113a and is arranged between the pixel electrode 111 and the counter electrode 115, are arranged on a substrate 10 of the organic light-emitting display apparatus 1 according to the first embodiment.

According to the present embodiment, light emitted by the organic emission layer 113a is reflected by the counter electrode 115, is transmitted through the pixel electrode 111, and is emitted toward the substrate 10. In other words, the organic light-emitting display apparatus 1 according to the present embodiment is a bottom-emitting type OLED apparatus.

The buffer layer 11 is formed on the substrate 10, and a thin-film transistor (TFT) TFT3 is arranged apart from a side of the pixel electrode 111. The TFT TFT3 includes the active layer 121, the gate electrode 123, the source electrode 125a, and the drain electrode 125b.

The active layer 121 may include the channel region 121c and the source region 121a and the drain region 121b, which are outside the channel region 121c and are doped with ion impurities. According to the present embodiment, the active layer 121 may contain the polysilicon, which is formed by crystallizing amorphous silicon via the crystallizing process. The first insulation layer 13, which is a gate insulation layer, is formed on the active layer 121, and the gate electrode 123 is arranged on the first insulation layer 13 at a location corresponding to the channel region 121c.

The second insulation layer 14, which is an interlayer insulation layer, is formed on the gate electrode 123, and the source electrode 125a and the drain electrode 125b are arranged on the second insulation layer 14.

The source electrode 125a and the drain electrode 125b contact the source region 121a and the drain region 121b of the active layer 121 via an opening (not shown) formed in the second insulation layer 14, respectively. The source electrode 125a and the drain electrode 125b may be formed as a single layer or multiple layers containing one or more metals selected from among aluminum (Al), platinum (Pt), palladium (Pd), silver (Ag), magnesium (Mg), gold (Au), nickel (Ni), neodymium (Nd), iridium (Ir), chrome (Cr), nickel(Ni), calcium (Ca), molybdenum (Mo), titanium (Ti), tungsten (W), and copper (Cu)

A barrier layer 112 is arranged at an end portion of the top surface of the pixel electrode 111. The barrier layer 112 may contain the same metal as the source electrode 125a and the drain electrode 125b.

The black matrix 12 is arranged between the substrate 10 and the TFT TFT3. The black matrix 12 is formed to cover edge portions of the pixel electrode 111 and contains an organic material that is resistant to a temperature equal to or higher than 550° C. The black matrix 12 may contain the material as shown in Formula 1 above. Meanwhile, the black matrix 12 may contain silicon resin.

FIGS. 5A through 5F are schematic sectional views showing a method of manufacturing the organic light-emitting display apparatus 3 according to the second embodiment.

Figure 5A:
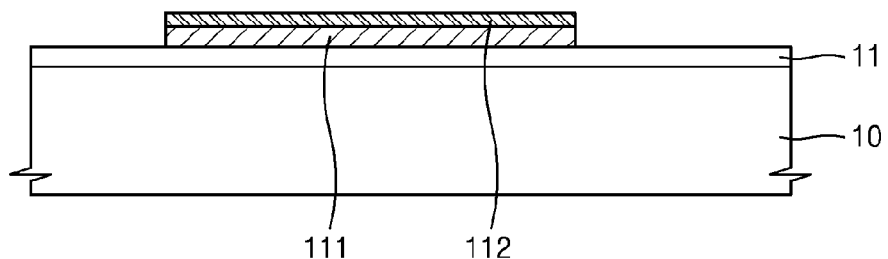
FIGS. 5A through 5F are schematic sectional views showing a method of manufacturing the organic light-emitting display apparatus according to the second embodiment.

Referring to FIG. 5A, the buffer layer 11 is formed on the substrate 10, a transparent conductive layer (not shown) is formed on the buffer layer 11, a metal layer (not shown) is formed on the transparent conductive layer, and the pixel electrode 111 and the barrier layer 112 are formed by patterning the transparent conductive layer and the metal layer at the same time.

Figure 5B:
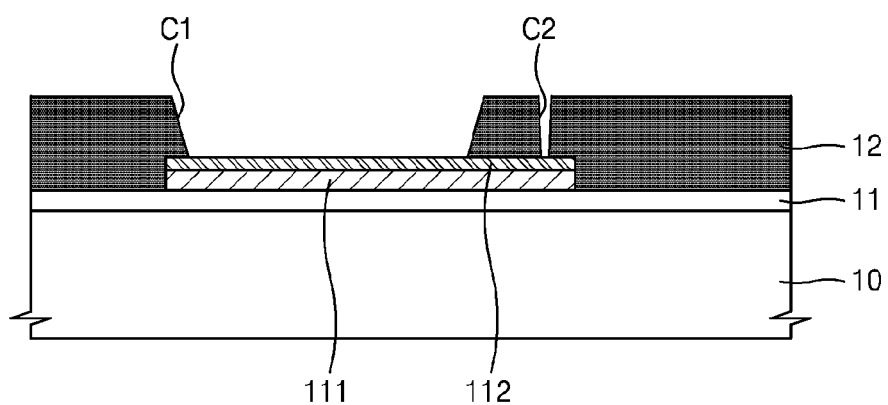

Referring to FIG. 5B, an insulation layer including an organic material is formed on the barrier layer 112, and the black matrix 12 is formed by patterning the same.

The black matrix 12 covers the edge portions of the barrier layer 112, and openings C1 and C2 are formed to expose the top surface of the pixel electrode barrier layer 112.

The black matrix 12 contains an organic material that is resistant to a temperature equal to or higher than 550° C. For example, the black matrix 12 may include the material shown in Formula 1 above. Furthermore, the black matrix 12 may be formed by using an alkali-soluble, UV-hardening silicon resin as a binder. Therefore, the black matrix 12 containing a silicon resin may be patterned by using a photo mask.

Figure 5C:
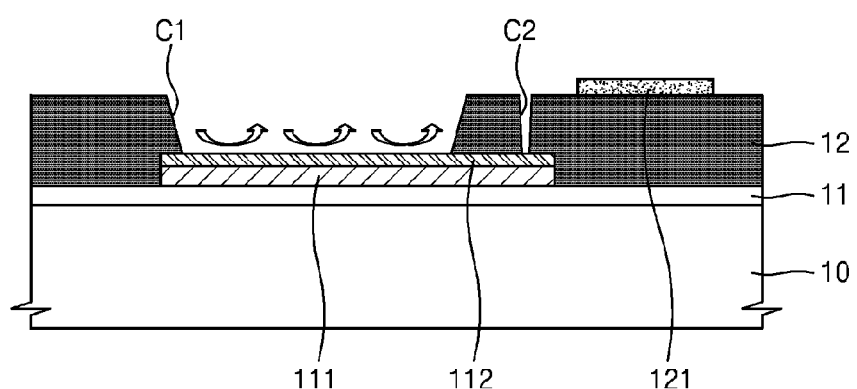

Referring to FIG. 5C, the active layer 121 is formed on the black matrix 12. The active layer 121 may be formed of an amorphous silicon first, and then the active layer 121 may be formed as a polysilicon via a crystalline process. Methods of crystallizing amorphous silicon may include rapid thermal annealing (RTA), solid phase crystallization (SPC), excimer laser annealing (ELA), metal induced crystallization (MIC), metal induced lateral crystallization (MILC), sequential lateral solidification (SLS), etc. Here, since the black matrix 12 below the active layer 121 contains a highly heat-resistant organic insulation material, the active layer 121 may be formed directly on the black matrix 12.

If the barrier layer 112 is not arranged on the pixel electrode 111 when the active layer 121 is dry-etched, the pixel electrode 111 may directly receive plasma damage.

However, since the barrier layer 112 is arranged on top of the pixel electrode 111, the pixel electrode 111 may be prevented from being damaged.

Figure 5D:
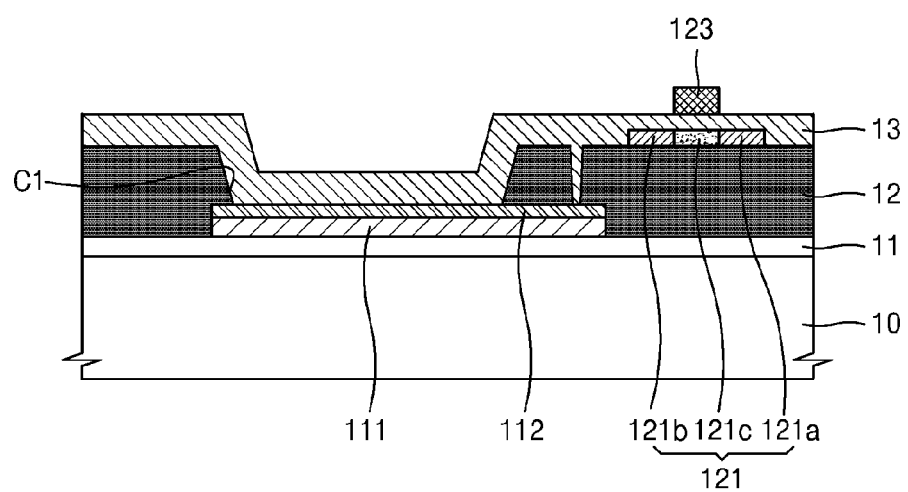

Referring to FIG. 5D, the first insulation layer 13 is formed on the black matrix 12, and the gate electrode 123 is formed on the first insulation layer 13.

Although not shown, the active layer 121 is doped with ion impurities by using the gate electrode 123 as a self-align mask. The active layer 121 includes the source region 121a and the drain region 121b that are doped with ion impurities and the channel region 121c arranged between the source region 121a and the drain region 121b.

Figure 5E:
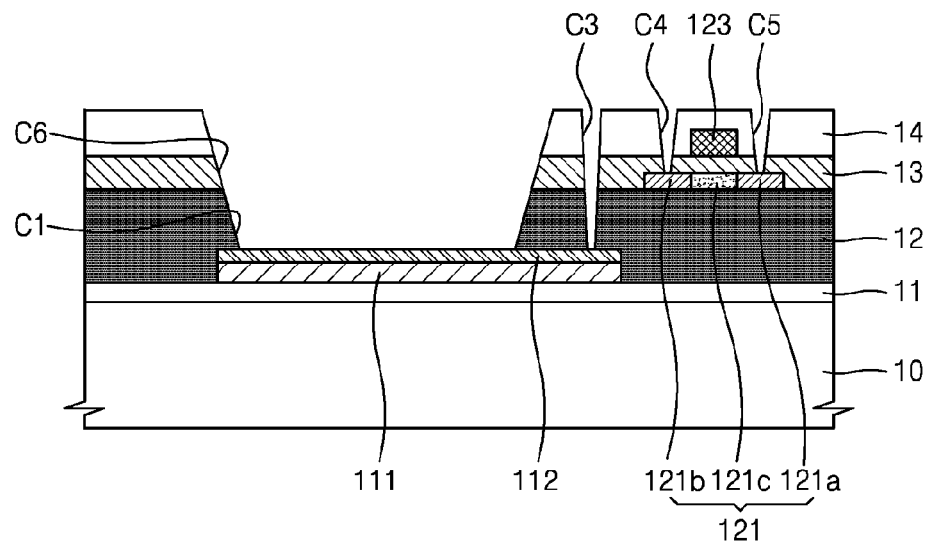

Referring to FIG. 5E, after the gate electrode 123 is formed, the second insulation layer 14 is formed. Openings C6 and C3 exposing the top surface of the pixel electrode 111 and openings C4 and C5 exposing the source region 121a and the drain region 121b are formed by simultaneously patterning the second insulation layer 14 and the first insulation layer 13. The opening C6 is formed to smoothly extend from the opening C1 of FIG. 2C, whereas the opening C3 is formed to smoothly extend from the opening C2 of FIG. 2C.

Figure 5F:
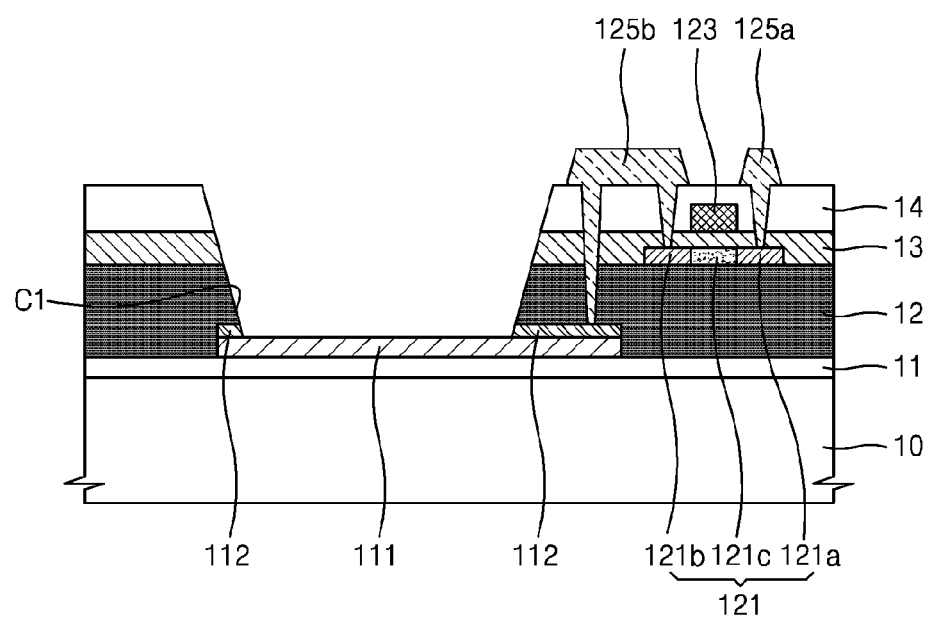

Referring to FIG. 5F, a metal layer (not shown) is formed on the result structure of the operation shown in FIG. 5E, and the source electrode 125a and the drain electrode 125b are formed by patterning the metal layer. Here, the top surface of the barrier layer 112 is removed.

A second metal layer (not shown) may contain a metal selected from among aluminum (Al), platinum (Pt), palladium (Pd), silver (Ag), magnesium (Mg), gold (Au), nickel (Ni), neodymium (Nd), iridium (Ir), chrome (Cr), nickel (Ni), calcium (Ca), molybdenum (Mo), titanium (Ti), tungsten (W), copper (Cu), and alloys thereof.

Meanwhile, although not shown, the third insulation layer 15 (refer to FIG. 4) is formed on the result structure of the operation shown in FIG. 5F, and the opening C7 is formed to expose the top surface of the pixel electrode 111. The third insulation layer 15 dads the edge portions of the pixel electrode 111 and to cover side surfaces of the black matrix 12.

In the organic light-emitting display apparatus 3 manufactured as described above, while the barrier layer 112 is formed above the pixel electrode 111, the barrier layer 112 protects the pixel electrode 111 while insulation layers are being patterned, thereby reducing damages to the pixel electrode 111.

Figure 6:
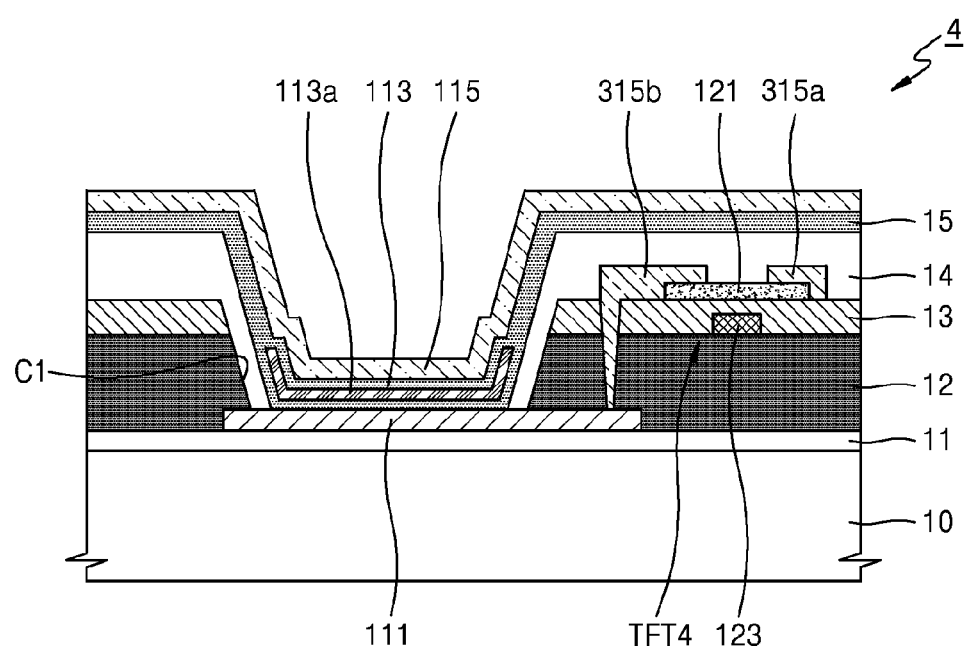
FIG. 6 is a schematic sectional view showing an organic light-emitting display apparatus according to a third embodiment.

FIG. 6 is a schematic sectional view showing an organic light-emitting display apparatus 4 according to a third embodiment. Hereinafter, descriptions of the present embodiment will focus on differences from the first embodiment and/or the second embodiment.

Referring to FIG. 6, in the organic light-emitting display apparatus 4 according to a third embodiment, the pixel electrode 111, the counter electrode 115, and the intermediate layer 113, which includes at least the organic emission layer 113a and is arranged between the pixel electrode 111 and the counter electrode 115, are arranged on a substrate 10 of the organic light-emitting display apparatus 1 according to the first embodiment.

According to the present embodiment, light emitted by the organic emission layer 113a is reflected by the counter electrode 115, is transmitted through the pixel electrode 111, and is emitted toward the substrate 10. In other words, the organic light-emitting display apparatus 4 according to the present embodiment is a bottom-emitting type OLED apparatus.

The buffer layer 11 is formed on the substrate 10, and a thin-film transistor (TFT) TFT4 is arranged apart from a side of the pixel electrode 111. The TFT TFT4 includes the active layer 121, the gate electrode 123, a source electrode 315a, and a drain electrode 315b.

The present embodiment discloses a bottom gate type TFT. The gate electrode 123 is formed directly on the black matrix 12, and the first insulation layer 13, which functions as a gate insulation layer, is formed on the gate electrode 123.

The active layer 121 is formed on the first insulation layer 13. The active layer 121 may contain amorphous silicon or a silicon oxide.

The source electrode 315a and the drain electrode 315b are formed on the active layer 121, the second insulation layer 14, which is an interlayer insulation layer, is formed on the gate electrode 123, and the source electrode 125a and the drain electrode 125b are formed on the second insulation layer 14.

As described above, according to the one or more of the above embodiments, an organic light-emitting display apparatus according to embodiments of the present disclosure may exhibit improved optical efficiency and reduced manufacturing cost.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. An organic light-emitting display apparatus comprising: a substrate;
  a thin-film transistor (TFT) arranged on the substrate and comprising an active layer, a gate electrode, a source electrode, and a drain electrode; a black matrix located between the substrate and the TFT; a pixel electrode located between the substrate and the TFT and having edge portions covered by the black matrix;
  an insulation layer covering the TFT and opening a top surface of the pixel electrode;
  an organic emission layer arranged on the pixel electrode; a counter electrode arranged on the organic emission layer, wherein an upper surface of the black matrix is higher than the top surface of the pixel electrode, and
  wherein the pixel electrode is directly connected to the source electrode or the drain electrode of the TFT through the black matrix and the active layer is formed directly on the black matrix.

2. The organic light-emitting display apparatus of claim 1, wherein the pixel electrode is connected to the source electrode or the drain electrode of the TFT via a contact hole formed in the black matrix.

3. The organic light-emitting display apparatus of claim 1, wherein the black matrix contains silicon resin.

4. The organic light-emitting display apparatus of claim 1, wherein the pixel electrode contains a transparent material, and the counter electrode contains a reflective material.

5. The organic light-emitting display apparatus of claim 1, wherein the black matrix contains a material that is resistant to a temperature equal to or higher than 550° C.

6. The organic light-emitting display apparatus of claim 1, wherein the insulating layer covers side surfaces of the black matrix.

7. The organic light-emitting display apparatus of claim 1, wherein the pixel electrode is located closer the substrate than the TFT.

8. The organic light-emitting display apparatus of claim 1, wherein one element selected from the active layer, the gate electrode, the source electrode, and the drain electrode of TFT is formed directly on the black matrix.

* * * * *